United States Patent [19]

Young et al.

[11] Patent Number: 5,060,192

[45] Date of Patent: Oct. 22, 1991

[54] CROSS-POINT SWITCH

[75] Inventors: William R. Young; William F. Johnstone, both of Palm Bay, Fla.

[73] Assignee: Harris Corporation, Melbourne, Fla.

[21] Appl. No.: 457,504

[22] Filed: Dec. 27, 1989

[51] Int. Cl.$^5$ .......................................... G11C 11/412
[52] U.S. Cl. ................................ 365/156; 365/189.12; 365/190
[58] Field of Search ............ 365/154, 156, 190, 189.12

[56] References Cited

U.S. PATENT DOCUMENTS 4,794,567 12/1988 Akatsuka ............................. 365/190
4,873,665 10/1989 Jiang et al. ........................... 365/154

FOREIGN PATENT DOCUMENTS 62-291168 12/1987 Japan ................................... 365/154

Primary Examiner—Joseph E. Clawson, Jr.
Attorney, Agent, or Firm—Barnes & Thornburg

[57] ABSTRACT

Each cross-point includes a first and second storage device with the next cycle information being stored in the first storage device and transferred to the second storage device which has the present cycle information. The output of the second storage means is used in combination with a second controlling input to control the switch or logic at a cross-point. In one embodiment, the cross-point state is stored in the storage devices and is combined with the input data to provide an output on the data output line. In another embodiment, input data is stored in the storage devices and is combined with input state selects to provide an output on the data output line.

20 Claims, 4 Drawing Sheets

CROSS-POINT SWITCH

BACKGROUND AND SUMMARY OF THE INVENTION

The present invention generally relates to data transmission circuits and more specifically to cross-point switches.

A cross-point switch is an array of cross-points wherein one of N inputs is selectively connected to one of M outputs. Any or all of the interconnections may change for each cycle of operation. The cross-point switch must be capable of handling a new selection without disturbing or interrupting the present selection until an update command is received. Although each input is only connected to one output and each output only has one input data, the cross-point switch also has the capability of connecting one input to more than one output simultaneously and if an OR function is acceptable, a single output may be connected to more than one input. For sake of clarity, the explanation within this patent will be described only with respect to each input being connected to only one output and each output having only one input connected thereto.

In prior art cross-point switches, each column or data out-line included a next state register NSR and a present state register CSR which are activated by a clock CLK. Each cross-point included a decoder for decoding the present state and the output of the decoder was combined in an AND gate with the specific data input line to provide an output on the data out-line. Thus the registers in combination with the decoder of the cell provided the data in and data out decoder. The basic structure is described in FIGS. 1 and 2 wherein four adjacent cross-points are illustrated in FIG. 2.

In the prior art structure assuming for example, that there are 32 possible inputs, each register would have to have five select lines, if only the true values are used by the decoders, or ten lines, if the true and negative complement are used. Using the true and complement select lines allows the decoder to consist of a five input gate. If there are also 32 outputs using ten select lines per output would require 320 select lines running the length of the cross-point switch. Although the prior art of FIGS. 1 and 2 are illustrated as an array, in one implementation by Sierra Semiconductor 32×32 cross-point switch SC 11320, each column including decoders and AND gates represents a 32:1 multiplexer. Thus, for 32 outputs, there are 32 multiplexers and 32 latches or registers. A separate decoder and bus is provided to read the information in the 32 latches.

Thus it is an object of the present invention to provide a cross-point switch which requires less area.

It is another object of the present invention to provide a cross-point switch which is more compact.

These and other objects are achieved by providing the function of the next and present registers of the prior art at the cross-points and providing the decoding logic external at the cross-points. Each cross-point includes a first and second storage devices with the next cycle information being stored in the first storage device and transferred to the second storage device which has the present cycle information. The output of the second storage device is used in combination with a second controlling input to control the switch or logic at a cross-point. The two inputs to the cross-point logic are an address or state select and input data.

In one embodiment, the cross-point state is stored in these storage devices. The decoders activate and store in the first storage devices the next interconnect configuration for that cross-point which is then transferred in a second cycle to the second storage device. The output of the second storage device is provided to the switch logic and combined with the data in line to provide an output on the data out-line.

In another embodiment, the first storage device stores the next cycle data and is transferred upon appropriate signal to the second storage device which contains the present cross-point data. The output of the second storage device is combined with a decoder signal for example, the input decode, so as to connect the logic combination thereof to the data out-line. Appropriate clock or transfer signals are provided to store and transfer information between the storage devices at each of the cross-points. Although the present and next input data are stored at each of the cross-points, only the decoded cross-points are completed.

The cross-point switch may be programmed by individually activating the input decodes while the output decoders selectively determine the cross-point state for each output line with respect to the individual input, or the output decoders can individually select the output lines while the input decoders selectively determine the cross-point state for each input line with respect to the individual output.

Other objects, advantages and novel features of the present invention will become apparent from the following detailed description of the invention when considered in conjunction with the accompanying drawings.

DETAILED DESCRIPTION OF THE DRAWINGS

Figure 3:
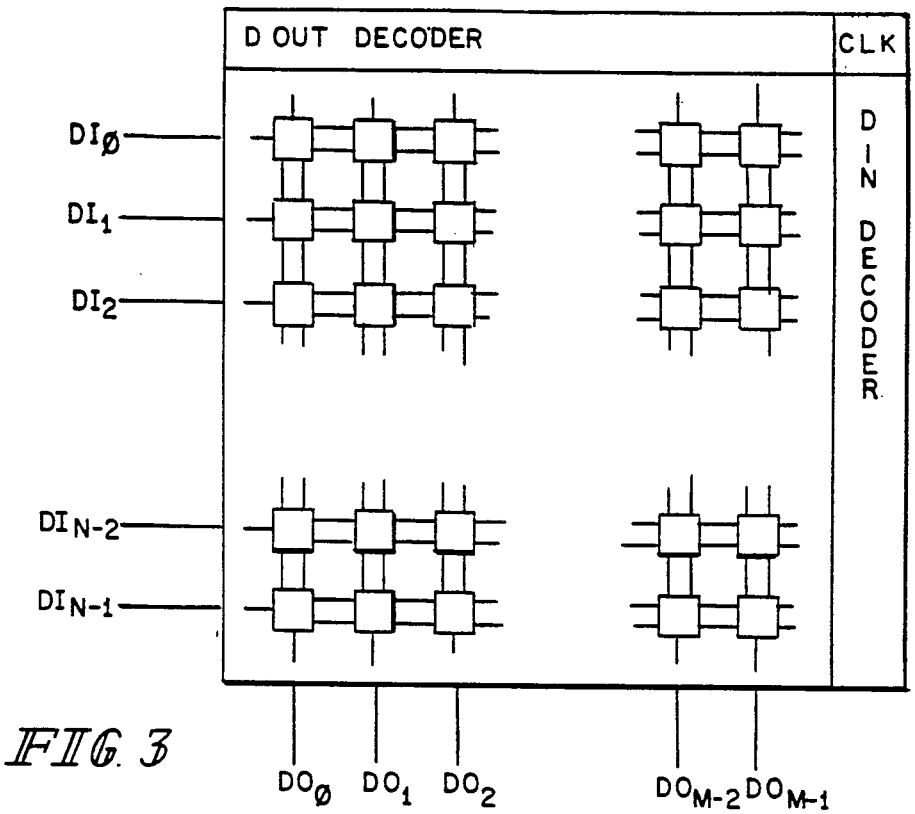
FIG. 3 is a block diagram of a cross-point switch incorporating the principles of the present invention.
Figure 4:
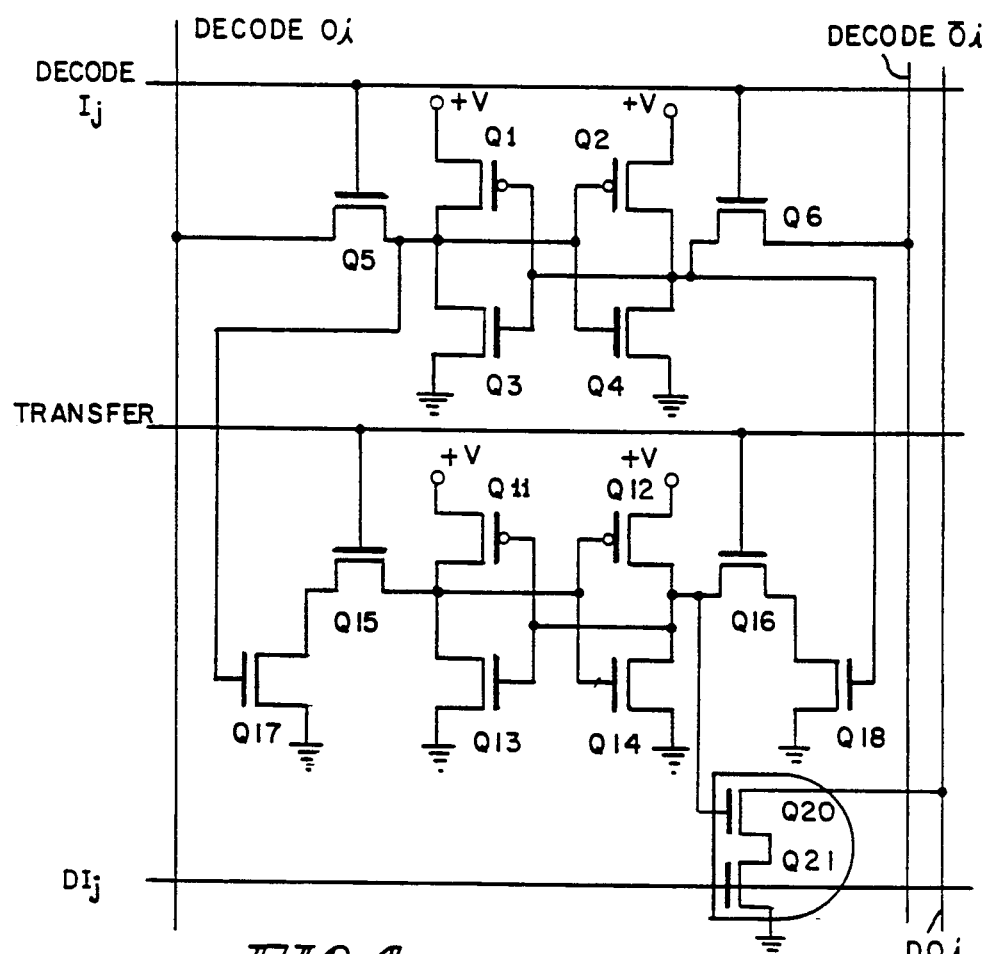
FIG. 4 is a schematic diagram of one embodiment of a cross-point switch for storing states incorporating the principles of the present invention.
Figure 5:
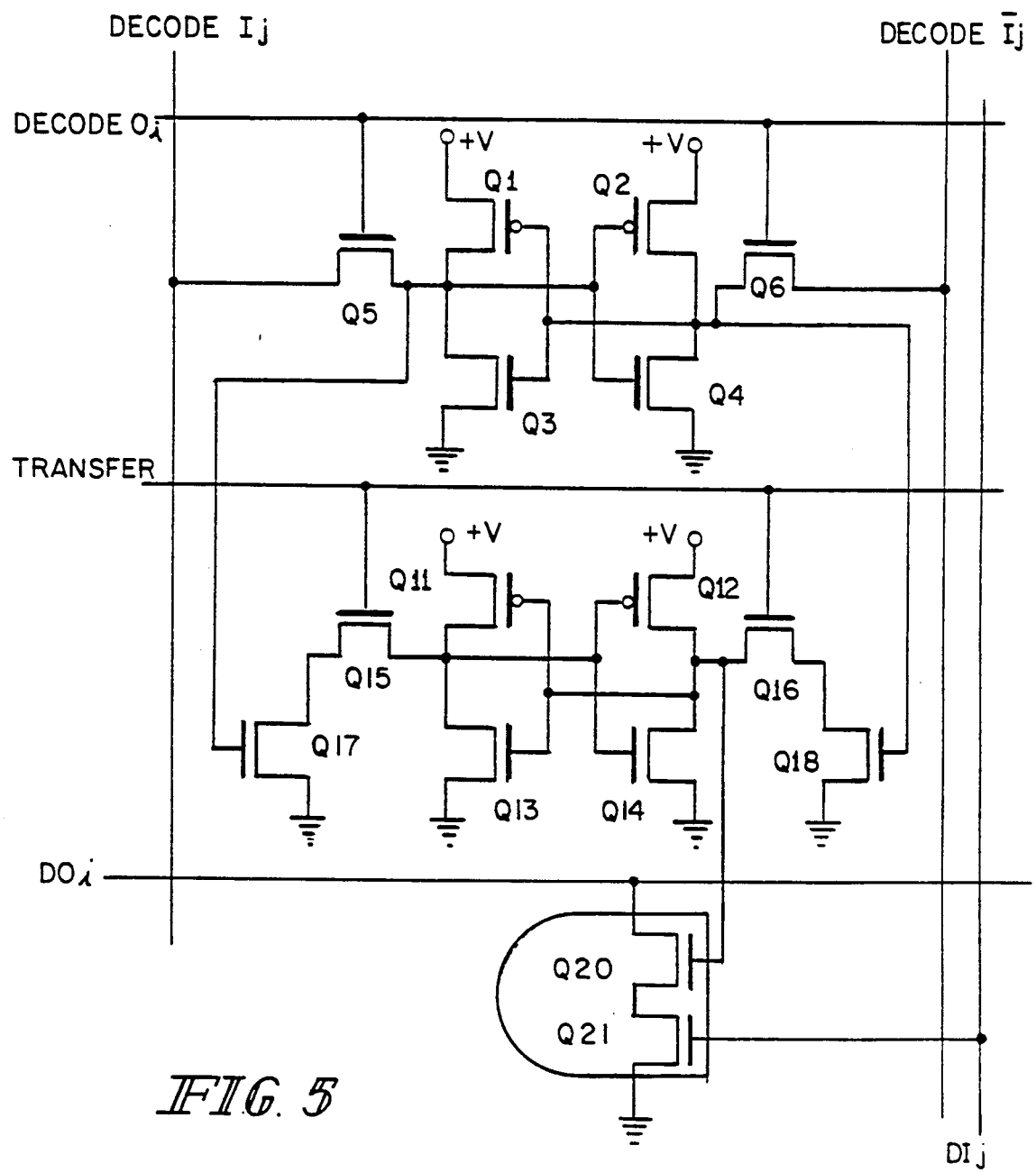
FIG. 5 is a schematic diagram of a second embodiment of a cross-point switch for storing states incorporating the principles of the present invention.

As illustrated in FIG. 3, the cross-point switch include data input lines DI0 through DIN-1 and output lines DO0 through DOM-1. A single set of data in decoders and a single set of data out decoders are provided as well as a clock for the cross-point switch. As will be explained with respect to the specific cross-point structure of FIGS. 4-6, each cross-point includes two storage devices for storing information with respect to the present cycle and the next cycle as well as a logic switch to provide input data to an output line. In FIGS. 4 and 5, the state, enabled or disabled, of the specific interconnection is stored in the first, next state, and second, present state, storage devices whereas in FIG. 6 the data of the present and next cycle are stored in the first and second storage devices.

Figure 1:
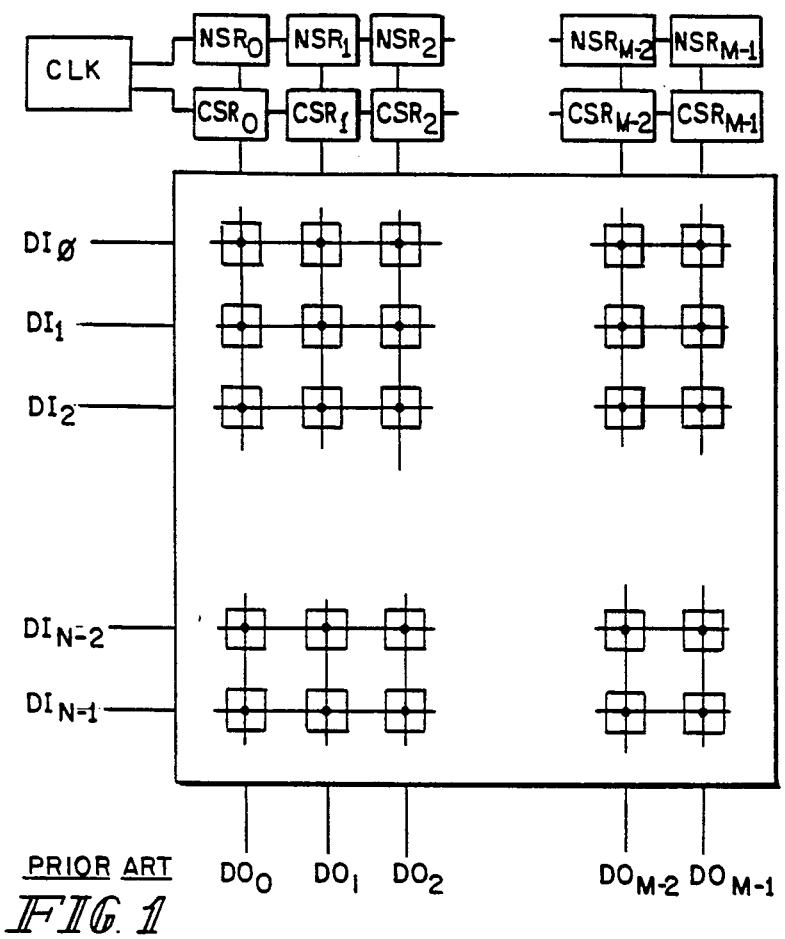
FIG. 1 is a block diagram of a cross-point switch of the prior art.

A cross-point switch as illustrated in FIG. 4 includes a first storage device having cross-coupled transistors Q1, Q2, Q3, Q4. A decode output line Decode $0_i$ is connected through an input switch Q5 to one of the ports of the first storage device and its inverse or Decode $\overline{0}_i$ is connected to the other port by an input switch Q6. Switches Q5 and Q6 are connected and activated by the input decoded signal Decode $I_j$. Thus the externally decoded input line and output line signal run the width and length of the array. It is a substantial reduction over that described for FIG. 1.

The second storage device includes transistors Q11, Q12, Q13, Q14. Each port includes a pair of series connected transistors Q16, Q18 and Q15, Q17. One transistor at each port Q15, Q16 are controlled by the transfer clock signal. The other transistors Q17, Q18 are controlled and activated by the state stored in the first storage device. Transistors Q15, Q16 isolate the second storage device's ports from the state signal of the first storage device when deactivated. Similarly by connecting the ports at the first storage device to the control gates of the second switches Q17, Q18, the ports of the first storage device is isolated from the second storage device.

One port of the second storage device is connected to the gate of transistor Q20 which is in series with a transistor Q21 whose input is from the input data line $DI_j$. When the output of the second storage device, represents an enable state and, is present at the same time that a data high is provided on the data input line $DI_j$, both transistors Q20 and Q21 are on and connect the output data line to ground. An AND gate symbol is provided around transistors Q20, Q21 since it performs an AND function equivalent to the AND gate of the prior art cell of FIG. 2.

Figure 2:
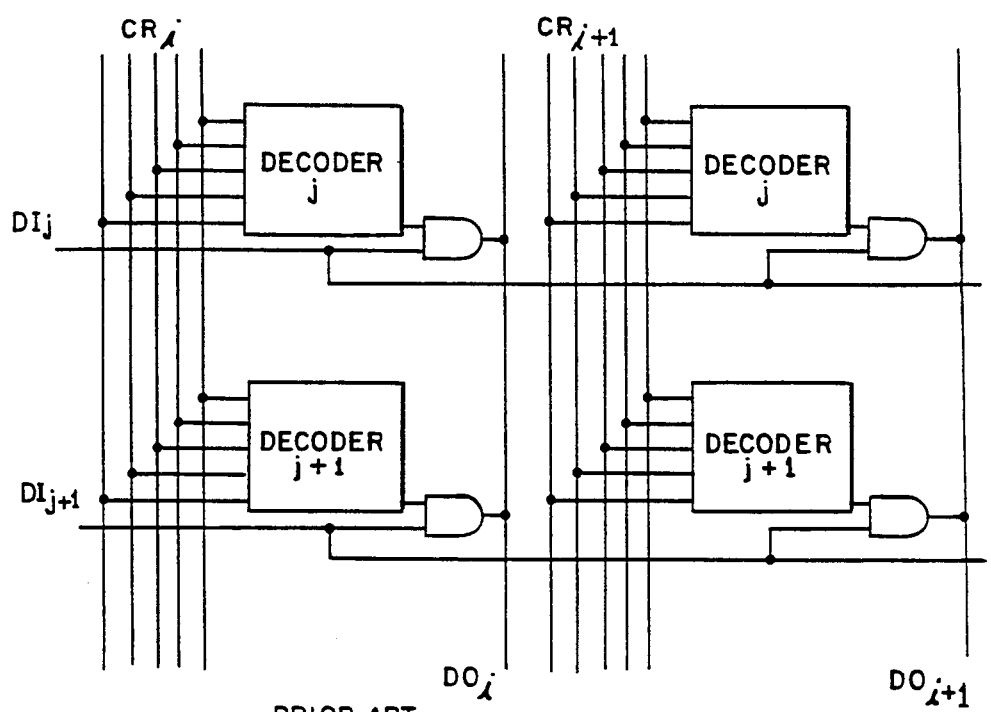
FIG. 2 is a schematic diagram of four adjacent cells of the cross-point switch of FIG. 1.

In comparing the cell of FIG. 4 with the cell of the prior art cell of FIG. 2, each cross-point includes a pair of present state and next state storage devices and an AND gate which combines the present state storage device's contents with the data input line and whose output is connected to the data output line. In the prior art, each cross-point includes a decoder which receives signals from a present address register for each output line. Only a pair of lines are provided along the length of the cross-point for each output line whereas as many as ten would be used as an equivalent in FIG. 2. Although the storage devices of FIG. 4 may have more transistors than the decoder at each of the cross-points of FIG. 2, a reduction in the number of interconnect lines substantially reduces the overall space required for the cross-point switch for the same capacity.

In operation, the cross-point switch of the embodiment of FIG. 4 is programmed for one cycle by individually activating the input decoders to activate the decode line of each row. The output or column decoders generate enable or disable states for each selected input line decode. Thereby, the next state enable or disable data for each column for each individual input line is applied in parallel.

A variation on the cross-point switch of FIG. 4, is illustrated in FIG. 5 wherein the two storage devices are identical in structure and makeup and only the control lines have been changed. In this configuration, the port input switches Q5, Q6 are controlled by the decode output line Decode $O_i$ and the information or interconnection state to be stored is determined by the decoder for the input having lines Decode $I_j$ and Decode $\overline{I}_j$. The output AND gate is connected identically in FIGS. 4 and 5. With the configuration of FIG. 5, the output lines are individually decoded while the input line decoders are selectively activated for the individual output lines. Thus all the inputs connected to a specific activated output line can be programmed simultaneously. It should be noted for sake of clarity that the storage devices have not been rotated 90° but the horizontal and vertical running lines of FIG. 5 are 90° with respect to that shown in FIGS. 3 and 4.

Figure 6:
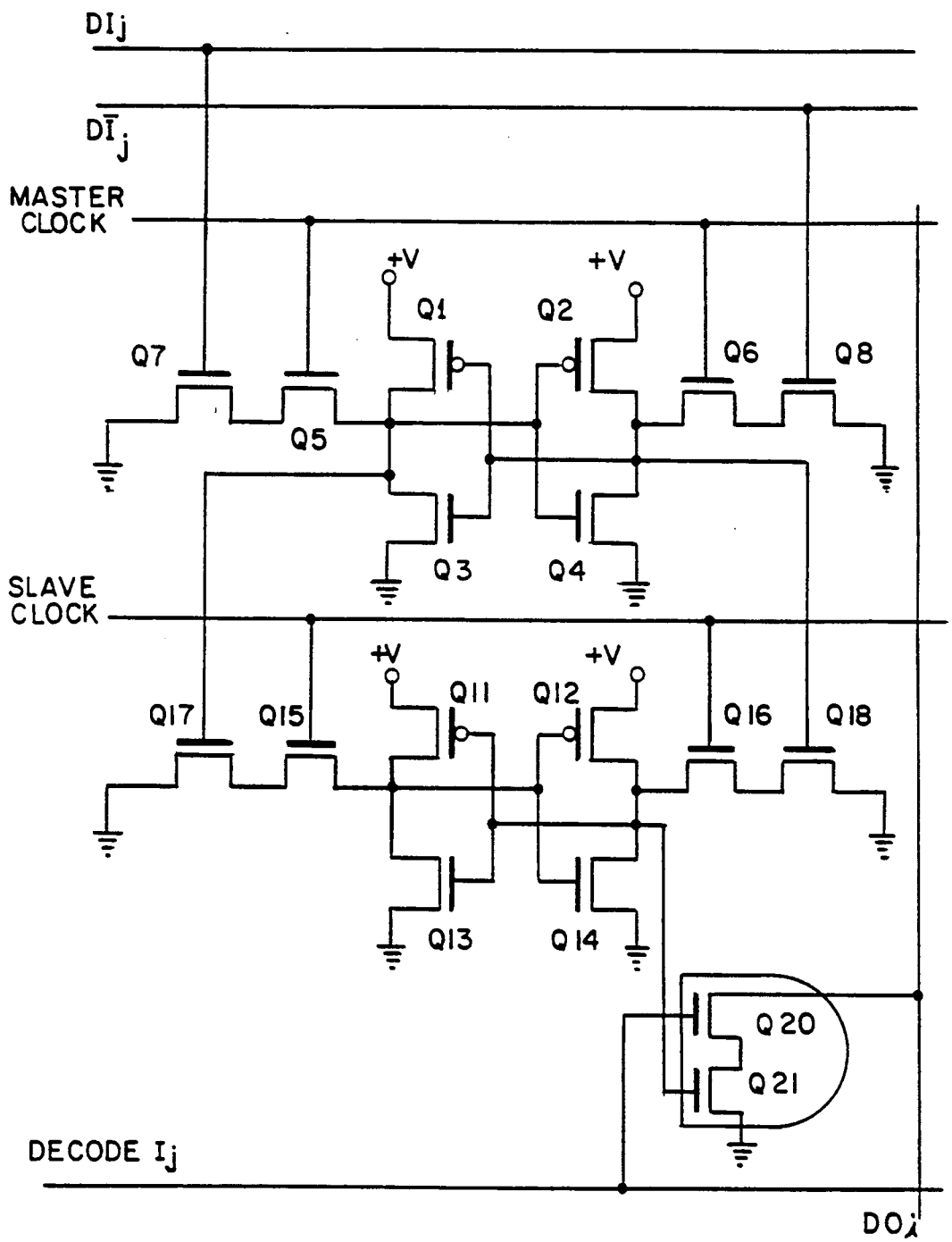
FIG. 6 is a schematic diagram of a third embodiment of a cross-point switch for storing data incorporating the principles of the present invention.

An even further embodiment of the cross-point switch including two storage elements per cross-point is illustrated in FIG. 6. The data for the present cycle and the next cycle are stored and the switching logic is controlled by the decoders. The first storage device includes cross-coupled transistors Q1, Q2, Q3, Q4. Each port includes a pair of series connected switches Q6, Q8, and Q5, Q7. The switches Q5 and Q6 are connected to a master clockline and isolate the transistors Q7 and Q8 from the ports. The input data is $DI_j$ and $\overline{DI}_j$ are connected to the gates of transistors Q7 and Q8 respectively. Thus on the master clock the data is stored in the first storage device.

The second storage device includes cross-coupled transistors Q11, Q12, Q13, Q14. Each port includes a pair of series connected switches Q16, Q18 and Q15, Q17. The switches Q15 and Q16 connect and isolate the transistors Q17 and Q18 respectively to and from the ports of the second storage device and are controlled by the slave clock. The transistors Q17 and Q18 are controlled by the port of the first storage device. One of the ports of the second storage element is connected to the gate of Q21 which is connected in series with the transistor Q20 to form an AND gate whose output is connected to the output line $DO_i$. Transistor Q20 receives as its input the input decoded signal Decode $I_j$.

The comparison of FIGS. 4 and 6 illustrates that the same two signals are being provided at the output AND gate, namely the decoded signal for the input line Decode $I_j$ or cross-point state and the data for that decoded line $DI_j$. In FIG. 4, the decoded signal is from the second storage device whereas in FIG. 6 the data value $DI_j$ is from the storage device. In both cases, the transistor Q20 which receives the decode or state signal isolates the transistor Q21 which receives the data input signal from the data output line $DO_i$. As with FIGS. 4 and 5, FIG. 6 shows a substantial reduction of lines throughout the cross-point switch array since only a single decode line for the input decode is provided with a pair of data input lines for each row. The column includes the column output line which has its own decoder logic external of the array. Thus FIG. 6 is a savings over the prior art of FIGS. 2.

The embodiments of FIGS. 4 and 5 are preferred since the cross-point states are generally set for a number of cycles of data. Also, individual cross-points are reprogrammed more often than the whole cross-point switch. By using a memory cell array for the cross points the contents of the cross-points can be read from the same bus which is used to program the cross-points. Thus no separate bus or decoders are needed to read the cross-point next state in addition to the bus and decoders used to program the cross-points.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A cross-point switch having a plurality of switching means at cross-points for selectively interconnecting N input lines and M output lines comprising:
   input decoder means for selecting one of N input lines;
   output decoder means for selecting one of M output lines;
   a clock means for providing a transfer signal;
   switch means at each cross-point being connected to a respective input and output line for transmitting data from said input line to said output line in a first state of said switch means and blocking transmission of data from said input line to said output line in a second state of said switch means; and
   at each cross-point, a first storage means connected to said input and output decoders means for storing a next cross-point state selected by said input and output decoders means, and a second storage means connected to said first storage means, to said switch means and to said clock means for storing a present cross-point state transferred from said first storage means in response to said transfer signal and controlling the state of said switch means as a function of said present cross-point state.

2. A cross-point switch according to claim 1 wherein said switch means includes a first and a second switch connected in series to an output line, said first switch is activated by said second memory means and said second switch is activated by an input on an input line, said first switch isolating said output line from said second switch.

3. A cross-point switch according to claim 2 wherein said first storage means includes a pair of input switches connecting a respective storage means port to said output decoder means and are activated by said input decoder means.

4. A cross-point switch according to claim 3 wherein said second storage means includes a pair of series connected input switches at each port of said second storage means, a first switch of each pair is activated by a corresponding port of said first storage means and a second switch of each pair is activated by said clock means.

5. A cross-point switch according to claim 4 wherein said second switch isolates a respective first switch from said second storage means port.

6. A cross-point switch according to claim 1 wherein said first storage means includes a pair of input switches connecting a respective storage means port to said output decoder means and activated by said input decoder means.

7. A cross-point switch according to claim 6 wherein said second storage means includes a pair of series connected input switches at each port of said second storage means, a first switch of each pair is activated by a corresponding port of said first storage means and a second switch of each pair is activated by said clock means.

8. A cross-point switch according to claim 7 wherein said second switch isolates a respective first switch from said second storage means port.

9. A cross-point switch according to claim 1 wherein said second storage means includes a pair of series connected input switches at each port of said second storage means, a first switch of each pair is activated by a corresponding port of said first storage means and a second switch of each pair is activated by said clock means.

10. A cross-point switch according to claim 9 wherein said second switch isolates a respective first switch from said second storage means port.

11. A cross-point switch according to claim 1 wherein said input decoder means individually selects said input lines while said output decoder means selectively determines the next cross-point state for each output line.

12. A cross-point switch according to claim 1 wherein said output decoder means individually selects said output lines while said input decoder means selectively determines the next cross-point state for each input line.

13. A cross-point switch having a plurality of switch means at cross-points for selectively interconnecting N input lines and M output lines comprising:
   input decoder means for selecting one of N input lines;
   output decoder means for selecting one of M output lines;
   first clock means for providing a first clock signal;
   second clock means for providing a second clock signal;
   switch means at each cross-point having a data input and being connected to a respective input decoder means and output line for transmitting any data at said data input to said output when selected by said input decoder means; and
   at each cross-point, a first storage means connected to an input line and said first clock means for storing input data from said input line in response to said first clock signal, and a second storage means connected to said first storage means, to said second clock means and to said data input of said switch means for storing data from said first storage means in response to said second clock signal and for controlling said switch means as a function of data stored in said second storage means.

14. A cross-point switch according to claim 13 wherein said switch means includes a first and second switch connected in series to an output line, said first switch is activated by said second memory means and said second switch is activated by an input decoder means, said second switch isolates said output line from said first switch.

15. A cross-point switch according to claim 13 wherein said first and second storage means each includes a pair of series connected switches at each port of said storage means, a first switch of each pair of said first and second storage means is activated by an input line or first storage means port respectively, a second switch of each pair of said first and second storage means is activated by said first and second clock signals respectively.

16. A cross-point switch according to claim 15 wherein said second switch isolates said port from said first switch.

17. A cross-point switch according to claim 1, wherein one of said decoders means selects a first storage means and the other of said decoder determines said next cross-point state to be written into said first storage means.

18. A cross-point switch according to claim 17, wherein said one of said decoder means selects a first storage means and the other of said decoder means reads said next cross-point from said first storage means.

19. A cross-point switch according to claim 18, wherein said one of said decoder means is said input decoder means and said other of said decoder means is said output decoder means.

20. A cross-point switch according to claim 18, wherein said one of said decoder means is said output decoder means and said other of said decoder means is said input decoder means.

* * * * *